US012761272B2

(12) United States Patent
Liao et al.

(10) Patent No.: US 12,761,272 B2
(45) Date of Patent: Oct. 13, 2026

(54) HETEROGENEOUS THERMAL INTERFACE MATERIAL ELEMENT AND PRESSING TEST DEVICE HAVING THE SAME

(71) Applicants: GLOBAL UNICHIP CORPORATION, Hsinchu City (TW); TAIWAN SEMICONDUCTOR MANUFACTURING COMPANY, LTD., Hsinchu (TW)

(72) Inventors: Chih-Chieh Liao, Hsinchu City (TW); Yu-Min Sun, Hsinchu City (TW); Chih-Feng Cheng, Hsinchu City (TW)

(73) Assignees: GLOBAL UNICHIP CORPORATION, Hsinchu City (TW); TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 117 days.

(21) Appl. No.: 19/021,092

(22) Filed: Jan. 14, 2025

(65) Prior Publication Data

US 2025/0370035 A1 Dec. 4, 2025

(30) Foreign Application Priority Data

May 31, 2024 (TW) ................................ 113120349

(51) Int. Cl.
*G01R 31/28* (2006.01)

(52) U.S. Cl.
CPC ..... *G01R 31/2891* (2013.01); *G01R 31/2889* (2013.01)

(58) Field of Classification Search
CPC ........................ G01R 31/2889; G01R 31/2891
See application file for complete search history.

(56) References Cited

U.S. PATENT DOCUMENTS 10,281,521 B2 * 5/2019 Song .................. G01R 31/2874
12,282,057 B2 * 4/2025 Yamada ............. G01R 31/2867
12,422,471 B2 * 9/2025 Chuang .............. G01R 31/2863

* cited by examiner

*Primary Examiner* — Gregory H Curran
(74) *Attorney, Agent, or Firm* — CKC & Partners Co., LLC

(57) ABSTRACT

A heterogeneous thermal interface material element includes a graphite liner and a soft thermal conductive sheet. The graphite liner has an upper layer, a lower layer opposite to the upper layer, an arc-shaped portion integrally connected to the upper layer and the lower layer so as to mutually form a C-shaped bag structure, and a sealing portion. The soft thermal conductive sheet is completely received in the C-shaped bag structure and sandwiched between the upper layer and the lower layer. The C-shaped bag structure is formed with a bag mouth sealed by the sealing portion. The soft thermal conductive sheet and the graphite liner are different materials. The thermal conductivity coefficient of the graphite liner is greater than that of the soft thermal conductive sheet, and the ductility of the soft thermal conductive sheet is greater than that of the graphite liner.

18 Claims, 11 Drawing Sheets

HETEROGENEOUS THERMAL INTERFACE MATERIAL ELEMENT AND PRESSING TEST DEVICE HAVING THE SAME

RELATED APPLICATIONS

This application claims priority to Taiwanese Application Serial Number 113120349, filed May 31, 2024, which are herein incorporated by reference.

BACKGROUND

Field of Invention

The present disclosure relates to a pressing test device. More particularly, the present disclosure relates to a pressing test device having a heterogeneous thermal interface material element.

Description of Related Art

Generally, when electrically testing a device under test (e.g., a semiconductor package chip, referred to a DUT hereinafter), the DUT will be placed on a testing socket, and a pressing connector will be pressed against the DUT to be connected to electrical terminals of the DUT so as to conduct electrical testing on the DUT. After the pressing connector is pressed against the DUT, the pressing connector can be quickly accumulated with a lot of heat energy. Thus, a thermal interface material (TIM) in the conventional technology will be placed on the lower surface of the pressing connector so as to fill a gap formed between the pressing connector and the DUT.

However, the TIM with limited performance cannot be provided with effective thermal conductivity so that the TIM can be easily fused to cause contamination problems on the surfaces of DUT due to heat accumulation, thereby not only increasing the risk of the DUT being damaged due to overheating, but also leading to inaccurate test data and affecting the test results.

Therefore, the above-mentioned technology apparently is still with inconvenience and defects and needed to be further develop. Hence, how to develop a solution to improve the foregoing deficiencies and inconvenience is an important issue that relevant persons engaged in the industry are currently unable to delay.

SUMMARY

One aspect of the present disclosure is to provide a pressing test device having a heterogeneous thermal interface material element for solving the difficulties mentioned above in the prior art.

In one embodiment of the present disclosure, a heterogeneous thermal interface material element includes a graphite liner and a soft thermal conductive sheet. The graphite liner includes an upper layer, a lower layer, an arc-shaped portion and a sealing portion. The lower layer is opposite to the upper layer. The arc-shaped portion is integrally connected to the upper layer and the lower layer so as to form a C-shaped bag structure together with the upper layer and the lower layer, and the C-shaped bag structure is formed with an internal space and a bag mouth that is connected to the internal space and sealed by the sealing portion. The soft thermal conductive sheet is completely received within the internal space of the C-shaped bag structure and sandwiched between the upper layer and the lower layer, and air gaps formed between the soft thermal conductive sheet and the arc-shaped portion, and between the soft thermal conductive sheet and the sealing portion, respectively. The soft thermal conductive sheet and the graphite liner are made of different materials, and a thermal conductivity coefficient of the graphite liner is greater than a thermal conductivity coefficient of the soft thermal conductive sheet, and a ductility of the soft thermal conductive sheet is greater than that of the graphite liner.

In one embodiment of the present disclosure, a heterogeneous thermal interface material element includes a graphite liner and a soft thermal conductive sheet. The graphite liner includes an upper layer, a lower layer, an arc-shaped portion and a sealing portion. The lower layer is opposite to the upper layer. The arc-shaped portion is integrally connected to the upper layer and the lower layer so as to form a C-shaped bag structure together with the upper layer and the lower layer, and the C-shaped bag structure is formed with an internal space and a bag mouth that is connected to the internal space and sealed by the sealing portion. The soft thermal conductive sheet is completely received within the internal space of the C-shaped bag structure and sandwiched between the upper layer and the lower layer, and air gaps formed between the soft thermal conductive sheet and the arc-shaped portion, and between the soft thermal conductive sheet and the sealing portion, respectively. A plurality of first granular convex portions and a plurality of second granular convex portions are respectively provided on two opposite surfaces of the soft thermal conductive sheet, and the first granular convex portions and the second granular convex portions are interlaced with each other, gaps between the first granular convex portions are directly contacted with the upper layer, and gaps between the second granular convex portions are directly contacted with the lower layer. A thermal conductivity coefficient of the graphite liner is greater than a thermal conductivity coefficient of the soft thermal conductive sheet, and a ductility of the soft thermal conductive sheet is greater than that of the graphite liner.

In one embodiment of the present disclosure, a pressing test device includes a device body, a pick-and-place portion connected to the device body for picking up and carrying a device under test (DUT), and the aforementioned heterogeneous thermal interface material element fixedly attached to a lower surface of the pick-and-place portion, and electrically connected to the pick-and-place portion for directly contacting with the DUT.

Thus, through the construction of the embodiments above, a heterogeneous thermal interface material element and a pressing test device having the same are able to implement respective advantages of these heat dissipation materials through the combination of heat dissipation materials with different characteristics, that is, the heterogeneous thermal interface material element of the present disclosure not only can increase the extension size and increase the contact area with the DUT after pressing, but also improve the original heat dissipation efficiency, thereby reducing the risks of overheating the DUT and inaccurate test data.

The above description is merely used for illustrating the problems to be resolved, the technical methods for resolving the problems and their efficacies, etc. The specific details of the present disclosure will be explained in the embodiments below and related drawings.

BRIEF DESCRIPTION OF THE DRAWINGS

The disclosure can be more fully understood by reading the following detailed description of the embodiment, with reference made to the accompanying drawings as follows.

DETAILED DESCRIPTION

Figure 1:
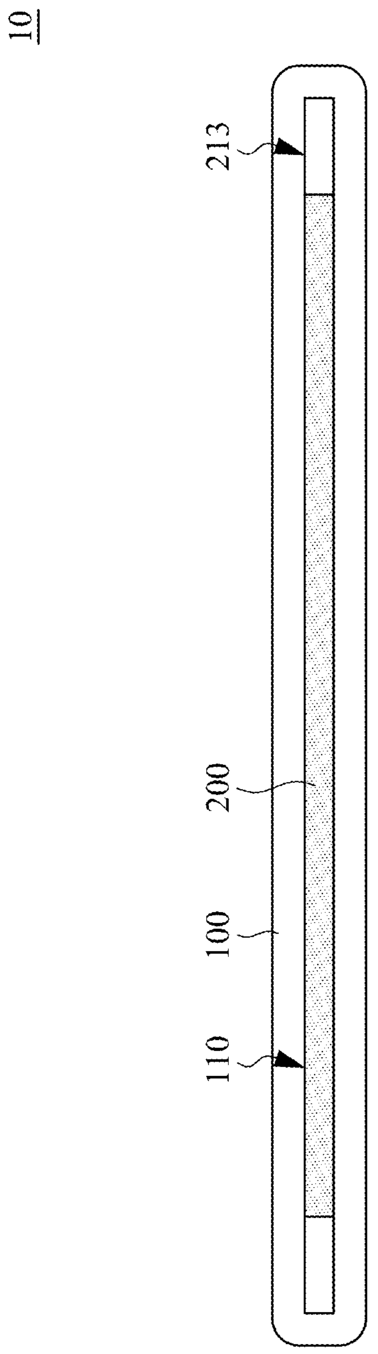
FIG. 1 is a schematic cross-sectional view of a heterogeneous thermal interface material element according to an embodiment of the present disclosure.

Reference will now be made in detail to the present embodiments of the present disclosure, examples of which are illustrated in the accompanying drawings. Wherever possible, the same reference numbers are used in the drawings and the description to refer to the same or like parts. According to the embodiments, it will be apparent to those skilled in the art that various modifications and variations can be made to the structure of the present disclosure without departing from the scope or spirit of the present disclosure.

Reference is now made to FIG. 1 in which FIG. 1 is a schematic cross-sectional view of a heterogeneous thermal interface material element 10 according to an embodiment of the present disclosure. In the embodiment, the heterogeneous thermal interface material element 10 includes a graphite liner 100 with high thermal conductivity and a soft thermal conductive sheet 200 with high flexibility. The graphite liner 100 is shaped in a bag having an internal space 110 therein. The soft thermal conductive sheet 200 is completely received within the internal space of the graphite liner 100, and sandwiched by the graphite liner 100. Each of two opposite sides of the soft thermal conductive sheet 200 is laterally separated from the graphite liner 100 by an air gap 213. The soft thermal conductive sheet 200 and the graphite liner 100 are made of different materials, and a thermal conductivity coefficient of the graphite liner 100 is greater than a thermal conductivity coefficient of the soft thermal conductive sheet 200, and a ductility of the soft thermal conductive sheet 200 is greater than that of the graphite liner 100.

More specifically, in this embodiment, for example, the graphite liner 100 is a graphite sheet, and the soft thermal conductive sheet 200 is an indium sheet. However, the disclosure is not limited to this.

Figure 2:
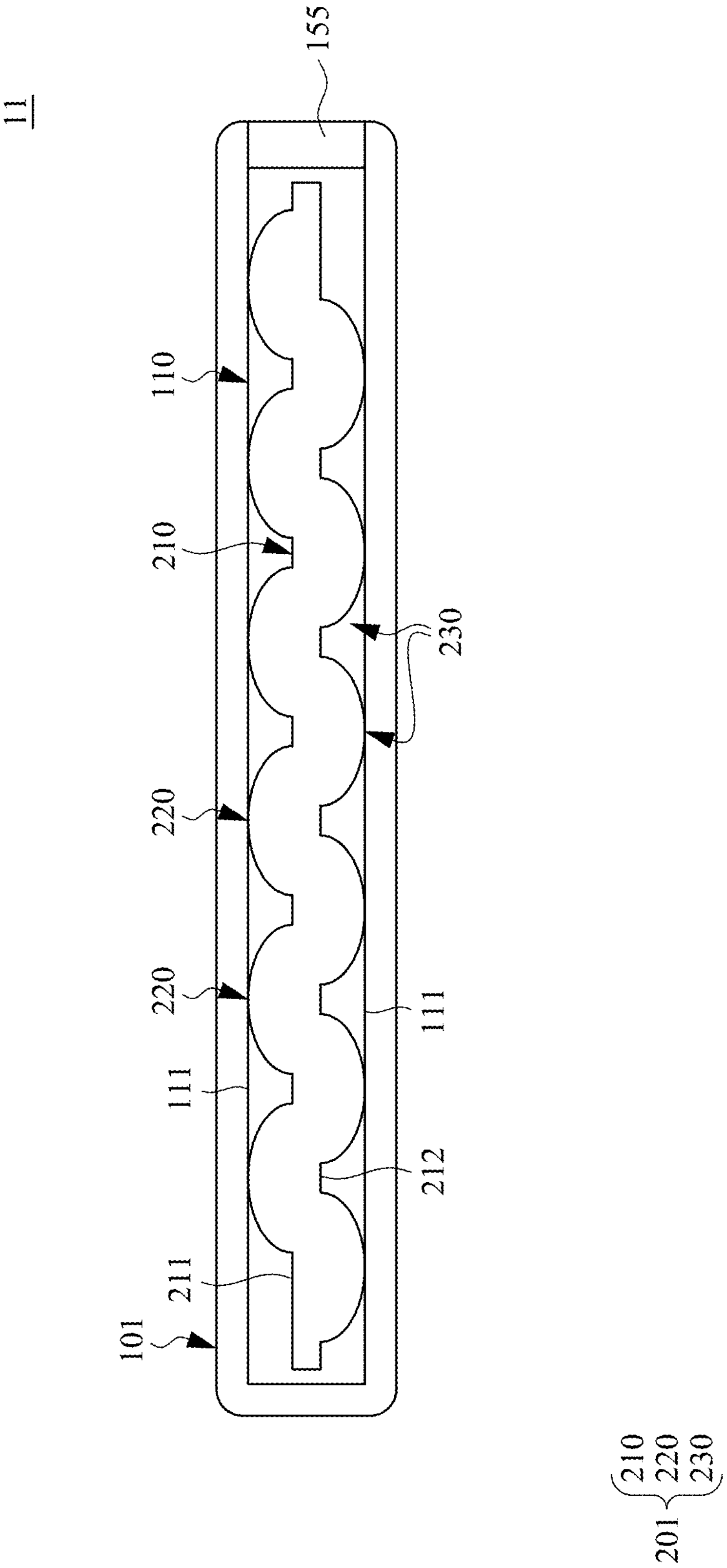
FIG. 2 is a schematic cross-sectional view of a heterogeneous thermal interface material element according to an embodiment of the present disclosure.

FIG. 2 is a schematic cross-sectional view of a heterogeneous thermal interface material element 11 according to an embodiment of the present disclosure. As shown in FIG. 2, this embodiment is substantially the same as the above-mentioned embodiment, except that a difference therebetween in this embodiment is that the soft thermal conductive sheet 201 includes an extensible sheet body 210, a plurality of first granular convex portions 220 and a plurality of second granular convex portions 230. The extensible sheet body 210 is received within the internal space 110, and provided with a first surface 211 and a second surface 212 which are opposite to each other. The first granular convex portions 220 are spaced distributed and convexly formed on the first surface 211 thereof to be directly contacted with the graphite liner 101 in the internal space 110. The second granular convex portions 230 are spaced distributed and convexly formed on the second surface 212 thereof to be directly contacted with the graphite liner 101 in the internal space 110.

More specifically, since the soft thermal conductive sheet 201 is made of soft material, when the first granular convex portions 220 are partially pressed to a certain extent, the first granular convex portions 220 are flattened or sunk into the first surface 211 thereof, and when the second granular convex portions 230 are partially pressed to a certain extent, the second granular convex portions 230 are flattened or sunk into the second surface 212 thereof so as to ensure that the soft thermal conductive sheet 201 directly abuts the inner walls 111 of the graphite liner 101 inside the graphite liner 101, thereby maintaining the thermal conductivity of the soft thermal conductive sheet 201 between opposite surfaces of the graphite liner 101.

Figure 3:
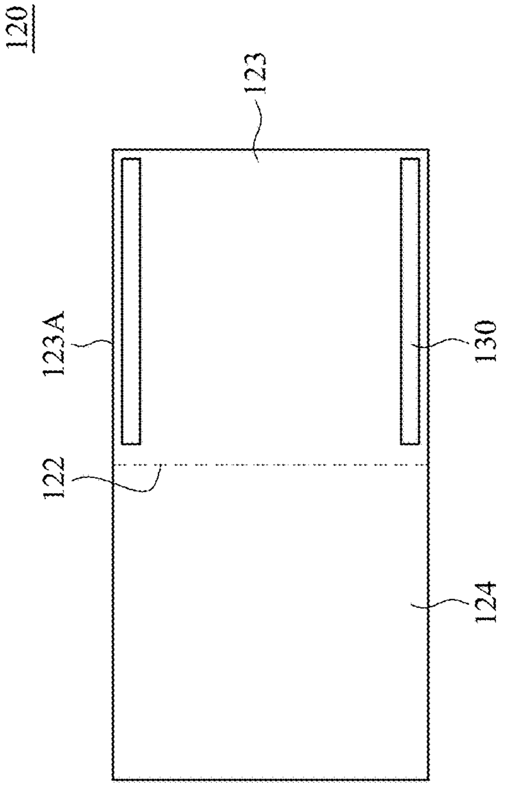
FIG. 3 to FIG. 16 are continuous operation schematic views and side views of fabricating the heterogeneous thermal interface material element.
Figure 4:
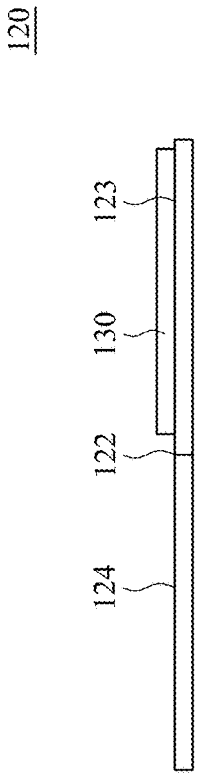
Figure 5:
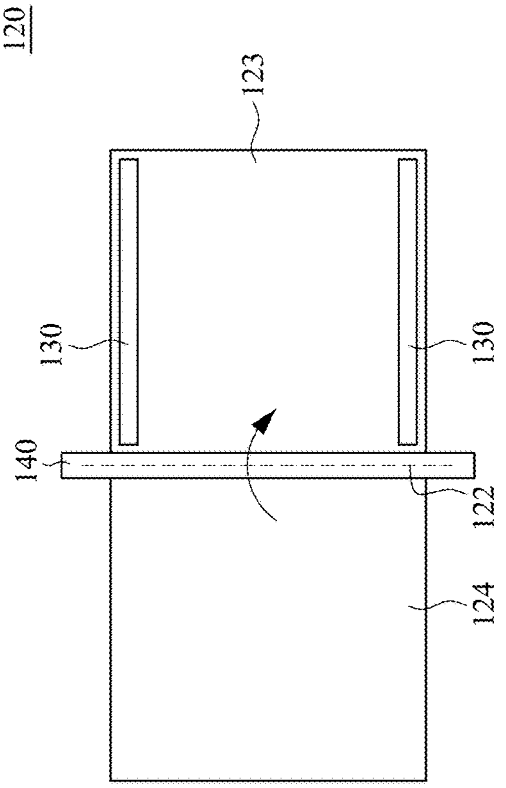
Figure 6:
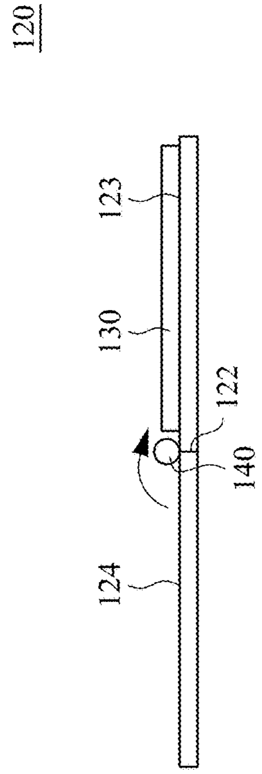
Figure 7:
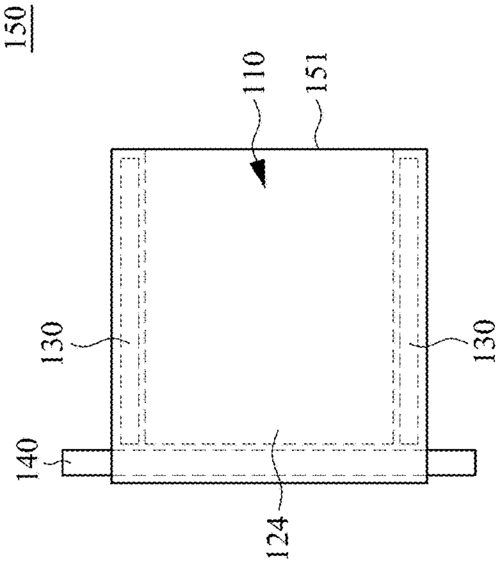
Figure 8:
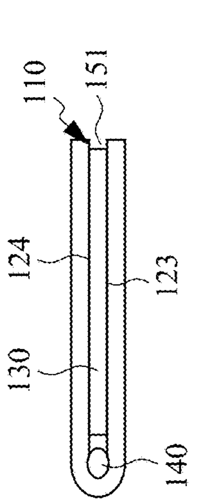
Figure 9:
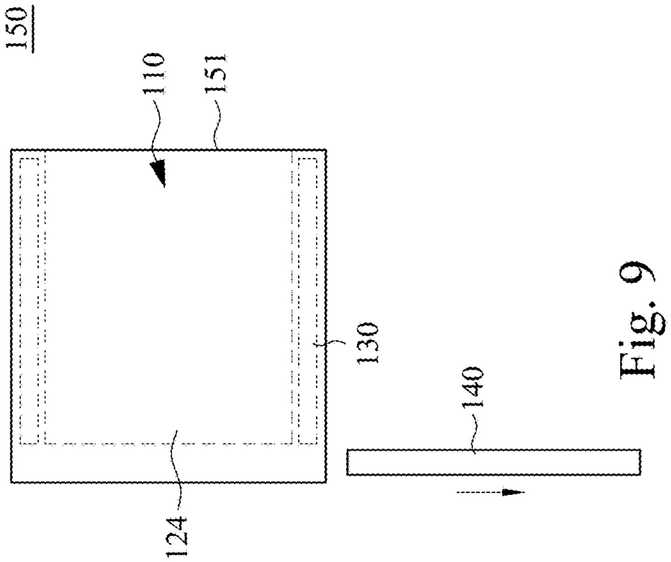
Figure 10:
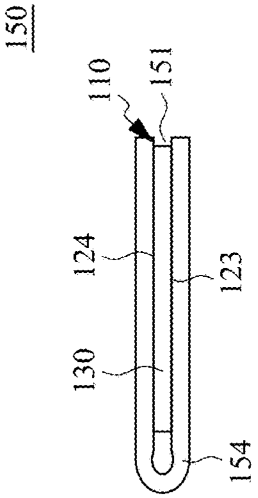
Figure 11:
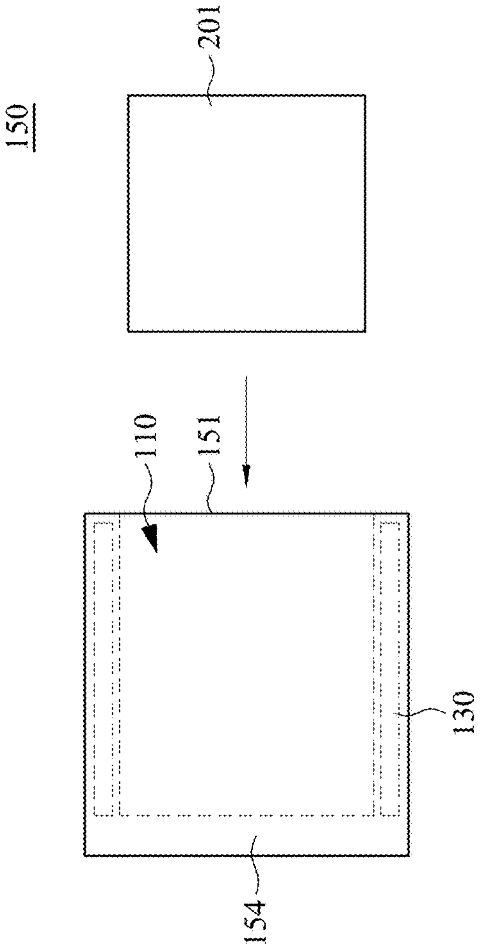
Figure 12:
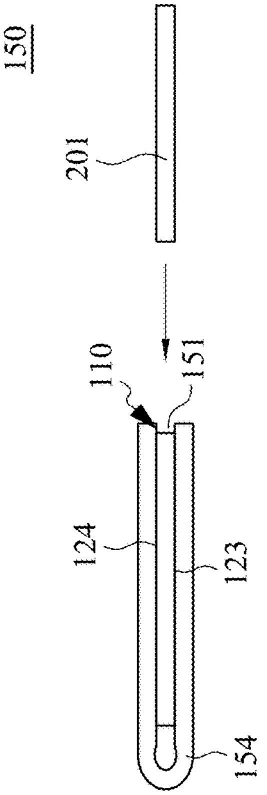
Figure 13:
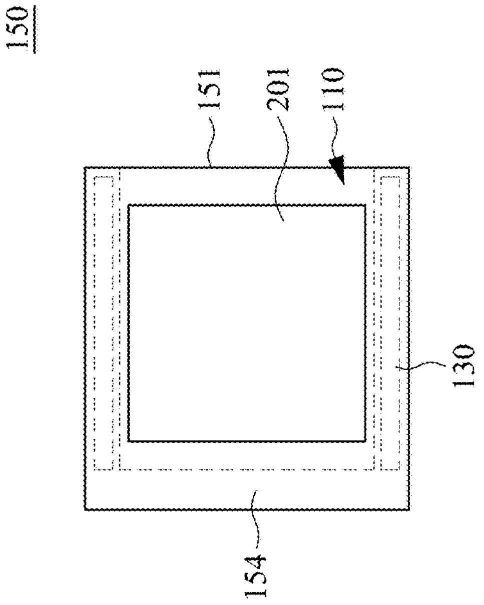
Figure 14:
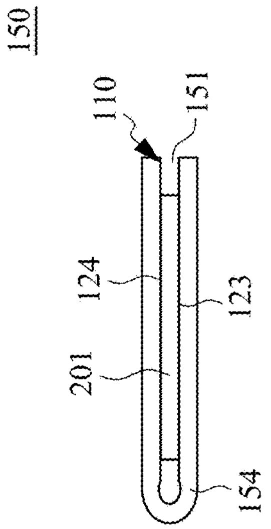
Figure 15:
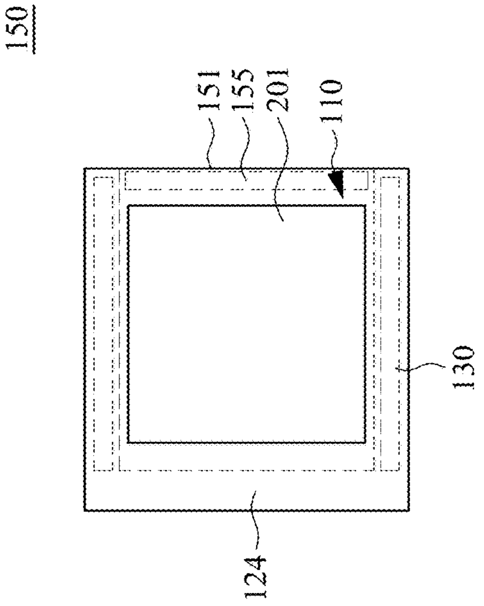
Figure 16:
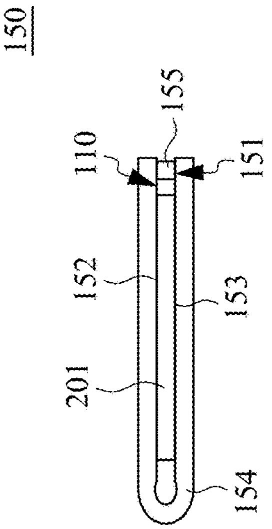

FIG. 3 to FIG. 16 are continuous operation schematic views and side views of fabricating the heterogeneous thermal interface material element, wherein FIG. 4 is a side view of FIG. 3, FIG. 6 is a side view of FIG. 5, FIG. 8 is a side view of FIG. 7, FIG. 10 is a side view of FIG. 9, FIG. 12 is a side view of FIG. 11, FIG. 14 is a side view of FIG. 13, and FIG. 16 is a side view of FIG. 15. In this embodiment, a manufacturing method of the heterogeneous thermal interface material element includes step 1 to step 5 as follows. In step 1, as shown in FIG. 3 and FIG. 4, a graphite sheet 120 with flexibility is provided. A front surface 121 of the graphite sheet 120 is provided with a center line 122, and the center line 122 evenly divides the front surface 121 of the graphite sheet 120 into a first half-surface area 123 and a second half-surface area 124.

In step 2, thermal conductive glue marks 130 are respectively coated on areas closing to two opposite side edges 123A of the first half-surface area 123 of the graphite sheet 120 (FIG. 3 and FIG. 4).

In step 3, as shown in FIG. 5 and FIG. 6, the graphite sheet 120 is bent in half according to the center line 122 of the graphite sheet 120 so that the first half-surface area 123 of the graphite sheet 120 faces towards and covers the second half-surface area 124, and the first half-surface area 123 and the second half-surface area 124 are bonded to each other through the thermal conductive glue marks 130 so as to form a C-shaped bag structure 150 with a C-shaped cross section (FIG. 7 and FIG. 8).

In one of embodiments, as shown in FIG. 5 and FIG. 6, an auxiliary rod 140 can be put and pressed on the center line 122 of the graphite sheet 120. Next, the graphite sheet 120 can be bent around the auxiliary rod 140, and the first half-surface area 123 of the graphite sheet 120 covers the second half-surface area 124 in a suspended manner. Thus, the C-shaped cross section shown on the left side of the C-shaped bag structure 150 (FIG. 8) avoids from extruding the crease directly along the center line 122 of the graphite sheet 120 and reduces the chance of damage to the graphite sheet 120 (FIG. 6 and FIG. 8). As FIG. 9 and FIG. 10, after thermal conductive glue marks 130 is curried, the auxiliary rod 140 is pulled out.

In step 4, as shown in FIG. 11 and FIG. 12, the aforementioned soft thermal conductive sheet 201 is laterally inserted into the internal space 110 of the C-shaped bag structure 150 via a bag mouth 151 of the C-shaped bag structure 150 so that the soft thermal conductive sheet 201 is completely received within the internal space 110 of the C-shaped bag structure 150 (FIG. 13 and FIG. 14).

In step 5, as shown in FIG. 15 and FIG. 16, a thermally conductive glue is injected into the bag mouth 151 of the C-shaped bag structure 150, so that the thermally conductive glue becomes a sealing portion 155 in the bag mouth 151. Thus, the soft thermal conductive sheet 201 is received within the internal space 110.

As shown in FIG. 2 and FIG. 16, the C-shaped bag structure 150 includes a upper layer 152, a lower layer 153, an arc-shaped portion 154 and a sealing portion 155. The lower layer 153 is opposite to the upper layer 152. The arc-shaped portion 154 is integrally connected to the upper layer 152 and the lower layer 153. The bag mouth 151 of the C-shaped bag structure 150 is connected to the internal space 110, and the bag mouth 151 is sealed by the sealing portion 155 so that the soft thermal conductive sheet 201 is completely received within the sealed internal space of the C-shaped bag structure 150.

It is noted, the heterogeneous thermal interface material element 10 described herein is different from a vapor chamber, so the C-shaped bag structure 150 has no thermal fluid filled within the internal space 110 thereof.

Figure 17:
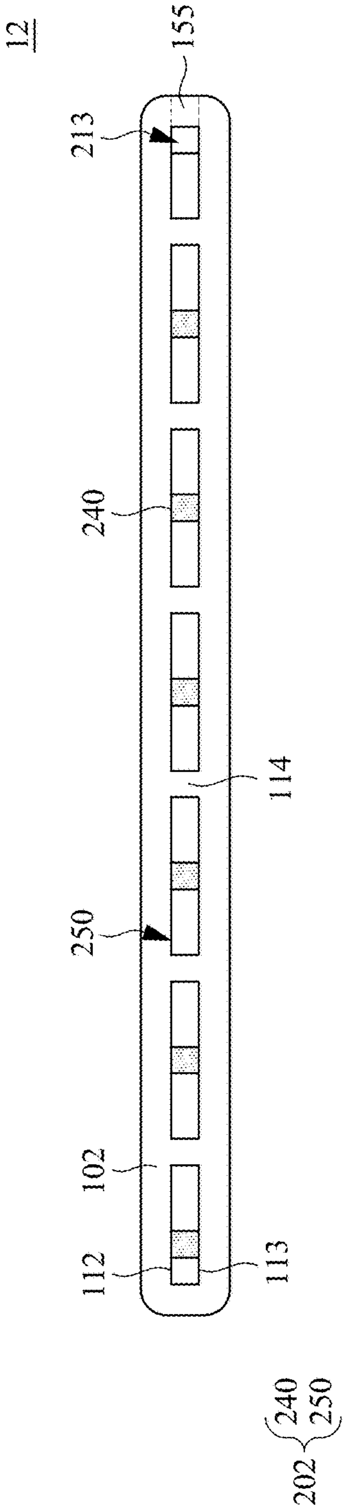
FIG. 17 is a schematic cross-sectional view of a heterogeneous thermal interface material element according to an embodiment of the present disclosure.
Figure 18:
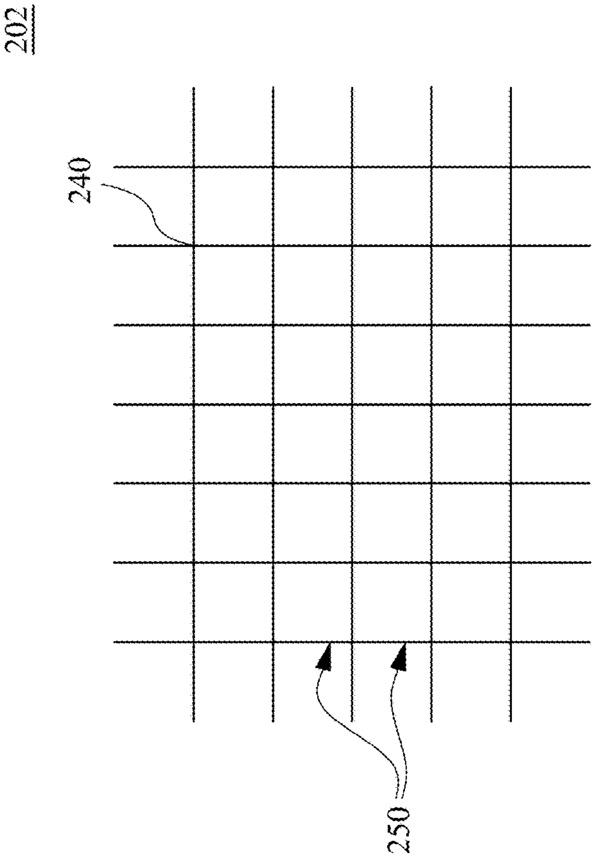
FIG. 18 is a front schematic view of the soft thermal conductive sheet of FIG. 17.

FIG. 17 is a schematic cross-sectional view of a heterogeneous thermal interface material element 12 according to an embodiment of the present disclosure. FIG. 18 is a front schematic view of the soft thermal conductive sheet 202 of FIG. 17. As shown in FIG. 17 and FIG. 18, this embodiment is substantially the same as the above-mentioned embodiment, except that the soft thermal conductive sheet 202 is a grid body rather than a meshless sheet. For example, the soft thermal conductive sheet 202 includes a mesh body 240 and plural mesh holes 250. Each of the mesh holes 250 are penetrated through and distributed on the mesh body 240. One part 114 of the graphite liner 102 extends from the lower inner wall 113 to be connected to the upper inner wall 112 of the graphite liner 102 through the mesh holes 250 of the soft thermal conductive sheet 202. However, the disclosure is not limited thereto. In another embodiment, the soft thermal conductive sheet 202 can also be a solid having porous or sponge-like structure.

In addition, in the above embodiments, for example, the material of the graphite liner 100, 101, 102 is graphite, and the material of the soft thermal conductive sheet 200, 201, 202 is 90% indium (In) and 10% silver (Ag), however, the disclosure is not limited thereto. In other embodiments, the soft thermal conductive sheets 200 to 202 also include copper sheets, silver sheets, or combinations thereof. The thermal conductivity coefficient of graphite liner 100, 101, 102 is 400-600 Watt/meter Kelvin (W/mk), and the thermal conductivity coefficient of the soft thermal conductive sheets 200 to 202 is 80-429 Watt/meter Kelvin (W/mk), in which the thermal conductivity coefficient of indium is 80 Watt/meter Kelvin (W/mk), the thermal conductivity coefficient of silver is 429 Watt/meter Kelvin (W/mk), and the thermal conductivity coefficient of gold is 317 Watt/meter Kelvin (W/mk). Furthermore, the thermal conductivity coefficient of the graphite liner 100-102 (e.g., graphite) in the planar axial direction (i.e., X-Y axis direction) reaches 400-600 Watt/meter Kelvin (W/mk), and the thermal conductivity coefficient of the graphite liner (e.g., graphite) 100, 101, 102 in the vertical axis direction (i.e., Z-axis direction) reaches 5-20 Watt/meter Kelvin (W/mk), and the thermal conductivity coefficient of the graphite liner 100-102 in a planar axial direction is higher than the thermal conductivity coefficient of the graphite liner 100-102 in a vertical axial direction. The thermal conductivity coefficient of the soft thermal conductive sheet 200, 201, 202 (e.g., indium sheet) in the planar axial direction (i.e., X-Y axis direction) reaches 67~80 Watt/meter Kelvin (W/mk). The heat resistance of graphite liner 100, 101, 102 is not greater than 400° C., and the heat resistance of the soft thermal conductive sheet 200, 201, 202 is not greater than 125° C., and Mohs hardness of graphite liner 100-102 is 2, and Mohs hardness of soft thermal conductive sheet 200, 201, 202 is Mohs hardness 1.2. The area of the heterogeneous thermal interface material (TIM) element 10-12 is approximately 3*3 cm2. However, the present disclosure is not limited to this.

Figure 19:
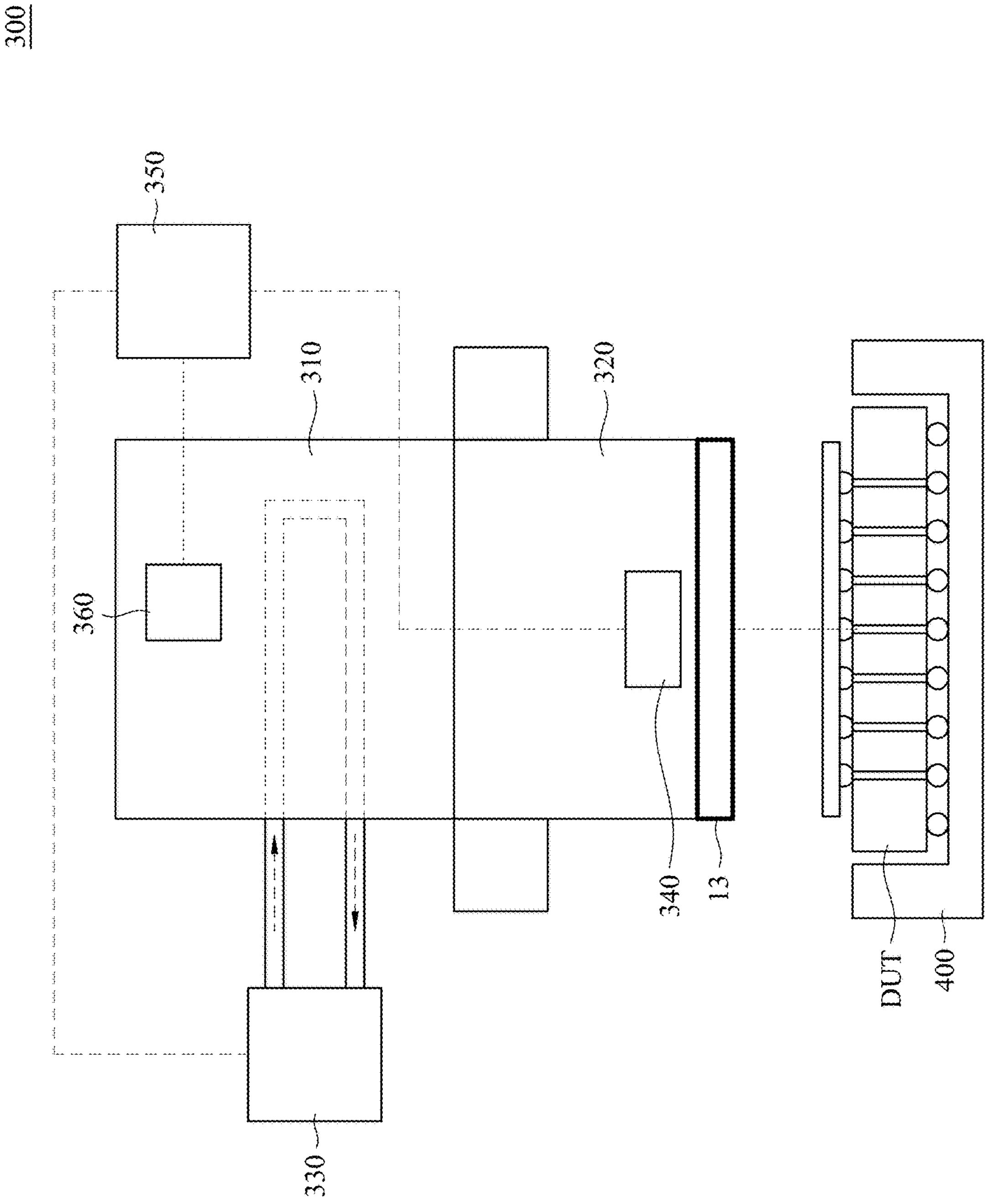
FIG. 19 is a schematic view of pressing test device according to an embodiment of the present disclosure.

FIG. 19 is a schematic view of pressing test device 300 according to an embodiment of the present disclosure. As shown in FIG. 19, the pressing test device 300 includes a device body 310, a pick-and-place portion 320, a test socket 400 and a heterogeneous thermal interface material element 13. The pick-and-place portion 320 is connected to one end of the device body 310 for picking up and carrying a device under test (refer to DUT hereinafter, e.g., semiconductor packaging chip) into the test socket 400. The aforementioned heterogeneous thermal interface material element 13 is fixedly attached to a lower surface of the pick-and-place portion 320 opposite to the device body 310, electrically connected to the pick-and-place portion 320 for directly contacting with the DUT. The pick-and-place portion 320 is, for example, a placement slot, a pick-up arm, or a pick-up suction cup, or other technical means for picking up the DUT. In this embodiment, the heterogeneous thermal interface material element 13 also can be the heterogeneous thermal interface material element of the above embodiments.

Specifically, in this embodiment, the pressing test device 300 further includes a heat exchange module 330, a temperature sensor 340 and a controller. The heat exchange module 330 is connected to the device body 310 for thermally exchanging the heat energy transferred from the DUT. The heat exchange module 330 sends heat dissipation liquid through the device body 310 for removing heat energy from the device body 310, for example. The temperature sensor 340 is disposed on the pick-and-place portion 320 for sensing the contact temperature of the heterogeneous thermal interface material element 13. The heater 360 is disposed on the device body 310 for heating the DUT. The controller 350 is electrically connected to the heat exchange module 330, the heater 360, and the temperature sensor 340 for correspondingly adjusting a heat exchanging capacity of the heat exchange module 330 and a heating capacity of the heater 360 in response to a sensing result of the temperature sensor 340. In addition, the controller 350 is electrically connected to the heterogeneous thermal interface material element 13 through the pick-and-place portion 320.

When the heterogeneous thermal interface material element 13 is disposed on the pressing test device 300, and the pressing test device 300 moves downward to press the DUT in the test socket 400, the heterogeneous thermal interface material element 13 between the DUT and the pick-and-place portion 320 can be severed as a thermal energy conduction medium and a pressure buffer.

It is noted, since the soft thermal conductive sheet 200, 201, 202 (e.g., indium sheet) of the heterogeneous thermal interface material element 10 have high ductility, when the pressing test device 300 presses the DUT through the heterogeneous thermal interface material element 13, the soft thermal conductive sheet 200, 201, 202 not only can remove the chip warpage formed on the surface of the DUT, but also extend laterally in the internal space 110 of the graphite liner 100, 101, 102 (FIG. 2), and significantly increase the overall contact area of the heterogeneous thermal interface material element 13 to DUT so as to improve the thermal conductivity of the heterogeneous thermal interface material element 13.

In addition, since the thermal conductivity coefficient of the graphite liner 100, 101, 102 in the planar axial direction (i.e., X-Y axis) is much higher than the thermal conductivity coefficient of the graphite liner 100, 101, 102 in the vertical axial direction. Compared to the conventional TIM material, it only allows all of thermal energy of the DUT to be transmitted vertically to the pick-and-place portion 320, so that most of the heat energy of the DUT can be quickly conducted from the lower layer 153 and the arc-shaped portion 154 of the graphite liner 100, 101, 102 to the upper layer 152 in sequence, then continuing the heat exchange work of the heat exchange module 330 (FIG. 16).

It is noted, since the soft thermal conductive sheet 200, 201, 202 (e.g., indium sheet) will be flowed due to the molten state during the high-temperature bonding process, the soft thermal conductive sheet 200, 201, 202 is loaded within in the internal space 110 of the graphite liner 100, 101, 102, it also can prevent the soft thermal conductive sheet 200, 201, 202 from flowing out from the internal space 110 of the graphite liner 100, 101, 102.

Thus, through the construction of the embodiments above, a heterogeneous thermal interface material element and a pressing test device having the same are able to implement respective advantages of these heat dissipation materials through the combination of heat dissipation materials with different characteristics, that is, the heterogeneous thermal interface material element of the present disclosure not only can increase the extension size and increase the contact area with the DUT after pressing, but also improve the original heat dissipation efficiency, thereby reducing the risks of overheating the DUT and inaccurate test data.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A heterogeneous thermal interface material element, comprising:

a graphite liner comprising an upper layer, a lower layer, an arc-shaped portion and a sealing portion, the lower layer that is opposite to the upper layer, the arc-shaped portion that is integrally connected to the upper layer and the lower layer so as to form a C-shaped bag structure together with the upper layer and the lower layer, and the C-shaped bag structure is formed with an internal space and a bag mouth that is connected to the internal space and sealed by the sealing portion; and a soft thermal conductive sheet completely received within the internal space of the C-shaped bag structure and sandwiched between the upper layer and the lower layer, and air gaps formed between the soft thermal conductive sheet and the arc-shaped portion, and between the soft thermal conductive sheet and the sealing portion, respectively, wherein the soft thermal conductive sheet and the graphite liner are made of different materials, and a thermal conductivity coefficient of the graphite liner is greater than a thermal conductivity coefficient of the soft thermal conductive sheet, and a ductility of the soft thermal conductive sheet is greater than that of the graphite liner.

2. The heterogeneous thermal interface material element of claim 1, wherein the soft thermal conductive sheet comprises:

an extensible sheet body having a first surface and a second surface opposite to each other;

a plurality of first granular convex portions spaced distributed and formed convexly on the first surface thereof to be directly contacted with the upper layer; and a plurality of second granular convex portions spaced distributed and formed convexly on the second surface thereof to be directly contacted with the lower layer.

3. The heterogeneous thermal interface material element of claim 1, wherein the soft thermal conductive sheet is one of a mesh body and a solid having porous or sponge-like structure, and one part of the graphite liner extends from the lower layer to be connected to the upper layer through the soft thermal conductive sheet.

4. The heterogeneous thermal interface material element of claim 1, wherein the soft thermal conductive sheet is one of an indium sheet, a copper sheet and a silver sheet.

5. The heterogeneous thermal interface material element of claim 1, wherein the thermal conductivity coefficient of the graphite liner is 400-600 W/mk, and the thermal conductivity coefficient of the soft thermal conductive sheet is 80-429 W/mk.

6. The heterogeneous thermal interface material element of claim 1, wherein the thermal conductivity coefficient of the graphite liner in a planar axial direction is higher than the thermal conductivity coefficient of the graphite liner in a vertical axial direction.

7. The heterogeneous thermal interface material element of claim 1, wherein a heat resistance of the graphite liner is not greater than 400° C., and a heat resistance of the soft thermal conductive sheet is not greater than 125° C.

8. The heterogeneous thermal interface material element of claim 1, wherein a Mohs hardness of the graphite liner is 2, and a Mohs hardness of the soft thermal conductive sheet is 1.2.

9. A heterogeneous thermal interface material element, comprising:

a graphite liner comprising an upper layer, a lower layer, an arc-shaped portion and a sealing portion, the lower layer that is opposite to the upper layer, the arc-shaped portion that is integrally connected to the upper layer and the lower layer so as to form a C-shaped bag structure together with the upper layer and the lower layer, and the C-shaped bag structure is formed with an internal space and a bag mouth that is connected to the internal space and sealed by the sealing portion; and a soft thermal conductive sheet completely received within the internal space of the C-shaped bag structure and sandwiched between the upper layer and the lower layer, and air gaps formed between the soft thermal conductive sheet and the arc-shaped portion, and between the soft thermal conductive sheet and the sealing portion, respectively, a plurality of first granular convex portions and a plurality of second granular convex portions are respectively provided on two opposite surfaces of the soft thermal conductive sheet, and the first granular convex portions and the second granular convex portions are interlaced with each other, gaps between the first granular convex portions are directly contacted with the upper layer, and gaps between the second granular convex portions are directly contacted with the lower layer, wherein a thermal conductivity coefficient of the graphite liner is greater than a thermal conductivity coefficient of the soft thermal conductive sheet, and a ductility of the soft thermal conductive sheet is greater than a ductility of the graphite liner.

10. The heterogeneous thermal interface material element of claim 9, wherein the soft thermal conductive sheet is one of a mesh body and a solid having porous or sponge-like structure, and one part of the graphite liner extends from the lower layer to be connected to the upper layer through the soft thermal conductive sheet.

11. The heterogeneous thermal interface material element of claim 9, wherein the soft thermal conductive sheet is one of an indium sheet, a copper sheet and a silver sheet.

12. The heterogeneous thermal interface material element of claim 9, wherein the thermal conductivity coefficient of the graphite liner is 400-600 W/mk, and the thermal conductivity coefficient of the soft thermal conductive sheet is 80-429 W/mk.

13. The heterogeneous thermal interface material element of claim 9, wherein the thermal conductivity coefficient of the graphite liner in a planar axial direction is higher than the thermal conductivity coefficient of the graphite liner in a vertical axial direction.

14. The heterogeneous thermal interface material element of claim 9, wherein a heat resistance of the graphite liner is not greater than 400° C., and a heat resistance of the soft thermal conductive sheet is not greater than 125° C.

15. The heterogeneous thermal interface material element of claim 9, wherein a Mohs hardness of the graphite liner is 2, and a Mohs hardness of the soft thermal conductive sheet is 1.2.

16. A pressing test device, comprising:

a device body;

a pick-and-place portion that is connected to the device body for picking up and carrying a device under test (DUT); and a heterogeneous thermal interface material element of claim 1 fixedly attached to a lower surface of the pick-and-place portion, and electrically connected to the pick-and-place portion for directly contacting with the DUT.

17. The pressing test device of claim 16, further comprising:

a heat exchange module connected to the device body for thermally exchanging the DUT.

18. The pressing test device of claim 17, further comprising:

a temperature sensor disposed on the pick-and-place portion for sensing a contact temperature of the heterogeneous thermal interface material element to the DUT;

a heater disposed on the device body for heating the DUT; and a controller electrically connected to the heat exchange module, the temperature sensor and the heater for correspondingly adjusting a heat exchanging capacity of the heat exchange module and a heating capacity of the heater in response to a sensing result of the temperature sensor.

* * * * *